(12) United States Patent
Ko et al.

(10) Patent No.: US 9,410,018 B2
(45) Date of Patent: *Aug. 9, 2016

(54) CURABLE COMPOSITION

(71) Applicant: LG CHEM, LTD., Seoul (KR)

(72) Inventors: Min Jin Ko, Daejeon (KR); Myung Sun Moon, Daejeon (KR); Jae Ho Jung, Daejeon (KR); Bum Gyu Choi, Daejeon (KR); Dae Ho Kang, Daejeon (KR); Min Kyoun Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/142,067

(22) Filed: Dec. 27, 2013

(65) Prior Publication Data

US 2014/0110749 A1 Apr. 24, 2014

Related U.S. Application Data

(63) Continuation-in-part of application No. 13/554,489, filed on Jul. 20, 2012, now Pat. No. 8,735,525, which is a continuation of application No. PCT/KR2011/000520, filed on Jan. 25, 2011.

(30) Foreign Application Priority Data

Jan. 25, 2010 (KR) .................. 10-2010-0006699
Jan. 25, 2011 (KR) .................. 10-2011-0007454

(51) Int. Cl.

| | | |
|---|---|---|
| *C08G 77/12* | (2006.01) | |
| *H01L 33/56* | (2010.01) | |
| *C08K 5/5419* | (2006.01) | |
| *C08K 5/5425* | (2006.01) | |
| *C08L 83/04* | (2006.01) | |
| *H01L 23/29* | (2006.01) | |
| *C08G 77/20* | (2006.01) | |
| *C08G 77/00* | (2006.01) | |

(52) U.S. Cl.
CPC .............. *C08G 77/12* (2013.01); *C08K 5/5419* (2013.01); *C08K 5/5425* (2013.01); *C08L 83/04* (2013.01); *H01L 23/296* (2013.01); *H01L 33/56* (2013.01); *C08G 77/20* (2013.01); *C08G 77/70* (2013.01); *H01L 2924/0002* (2013.01)

(58) Field of Classification Search
CPC .............................. C08L 83/04; H01L 23/296
See application file for complete search history.

(56) References Cited

U.S. PATENT DOCUMENTS

| | | | |
|---|---|---|---|
| 3,974,122 A | 8/1976 | Sato et al. | |
| 3,996,195 A | 12/1976 | Sato et al. | |
| 7,527,871 B2 * | 5/2009 | Morita et al. | ................. 428/447 |
| 8,258,502 B2 * | 9/2012 | Yoshitake et al. | .............. 257/40 |
| 2004/0116640 A1 | 6/2004 | Miyoshi | |
| 2014/0132892 A1 * | 5/2014 | Ko et al. | ......................... 349/69 |

FOREIGN PATENT DOCUMENTS

| | | |
|---|---|---|
| CN | 101389695 A | 3/2009 |
| EP | 559 575 | 8/1993 |
| EP | 1988125 A2 | 11/2008 |
| JP | 2005-105217 A | 4/2005 |
| JP | 2008-001828 A | 1/2008 |
| JP | 2009-527622 A | 7/2009 |
| JP | 2010-001335 A | 1/2010 |
| KR | 10-2006-0096429 A | 9/2006 |
| KR | 10-2008-0104279 A | 12/2008 |
| WO | 2005/033207 A1 | 4/2005 |
| WO | 2007/100445 * | 9/2007 |
| WO | 2007/100445 A2 | 9/2007 |
| WO | 2013/015591 * | 1/2013 |

OTHER PUBLICATIONS

International Search Report issued in International Appln. No. PCT/KR2011/000520, mailed Oct. 18, 2011, 2 pages.

Office Action issued in Chinese Patent Applicatoin No. 201180007132.1 on Jul. 30, 2013 along with a partial English translation (13 pgs.).

Office Action issued in European Patent Application No. 11 734 910.0-1301 on Nov. 10, 2014, 6 pages.

\* cited by examiner

*Primary Examiner* — Margaret Moore
(74) *Attorney, Agent, or Firm* — Rothwell, Figg, Ernst & Manbeck, P.C.

(57) ABSTRACT

The present application relates to a curable composition. A curable composition may be provided; which shows excellent processability and workability; which shows excellent light extraction efficiency, crack resistance, hardness, thermal shock resistance and adhesive strength after curing; and which has excellent reliability and long-term reliability under high-temperature and/or high-moisture conditions. Also, turbidity and surface stickiness may be prevented in the cured product.

21 Claims, No Drawings

CURABLE COMPOSITION

CROSS-REFERENCE TO RELATED APPLICATION

This application is a continuation-in-part of U.S. patent application Ser. No. 13/554,489, filed on Jul. 20, 2012, which is a continuation application of International Application PCT/KR2011/000520, with an international filing date of Jan. 25, 2011, which claims priority to and the benefit of Korean Patent Application No. 10-2010-0006699, filed Jan. 25, 2010, and of Korean Patent Application No. 10-2011-0007454, filed Jan. 25, 2011, the disclosure of which are incorporated herein by reference in their entireties.

TECHNICAL FIELD

The present application relates to a curable composition.

BACKGROUND ART

As a light emitting diode (LED), particularly as a blue or UV LED having an emission wavelength of approximately 250 nm to 550 nm, a high-brightness LED product using a compound semiconductor made of a GaN compound such as GaN, GaAlN, InGaN or InAlGaN has been obtained. Also, a high-definition full color image may be formed using a technique of combining red and green LED's with a blue LED. For example, a technique of preparing a white LED by combining a blue LED or UV LED with a phosphor has been known. Such LED's have been increasingly required for backlighting or general lighting in liquid crystal displays (LCD's).

As an LED encapsulant, an epoxy resin having high adhesive strength and excellent dynamic durability has been widely used. However, the epoxy resin has problems in that it has low transmittance with respect to light having blue to UV wavelength regions, and also shows poor lightfastness. Therefore, techniques in order to solve the problems as described above have been proposed, for example, in Japanese Patent Laid-Open Publication Nos. Hei11-274571, 2001-196151 and 2002-226551. However, the encapsulants described in these literatures show insufficient lightfastness.

As a material that has excellent lightfastness with respect to the low wavelength range, a silicone resin has been known. However, the silicone resin has disadvantages in that its heat resistance is poor, and its surface becomes sticky after curing. Also, in order to effectively apply the silicone resin as an LED encapsulant, characteristics such as a high refractive property, crack resistance, surface hardness, adhesive strength and thermal shock resistance must be secured.

DISCLOSURE

Technical Problem

The present application provides a curable composition.

Technical Solution

The present application relates to a curable composition. The curable composition may include (A) a polymerized product; (B) a crosslinked organosiloxane compound, which is represented by an average composition formula of Formula 2 and of which a molar ratio of an alkenyl group bound to a silicon atom with respect to the total silicon atoms ranges from 0.15 to 0.35; and (C) a hydrogen siloxane compound, which is represented by Formula 3 and of which a molar ratio of a hydrogen atom bound to a silicon atom with respect to the total silicon atoms ranges from 0.2 to 0.8. The polymerized product may include a linear organosiloxane compound, which is represented by an average composition formula of Formula 1 and of which a molar ratio of an alkenyl group bound to a silicon atom with respect to the total silicon atoms ranges from 0.02 to 0.2.

In the curable composition, the organosiloxane compound (B) is included in a weight ratio of 50 parts by weight to 700 parts by weight relative to 100 parts by weight of the linear organosiloxane compound included in the polymerized product (A).

In the curable composition, a molar ratio of the hydrogen atom bound to a silicon atom in compound (C) with respect to the alkenyl group bound to a silicon atom in the linear organosiloxane compound of the polymerized product (A) and the crosslinked organosiloxane compound (B) is in a range of 0.8 to 1.2.

$(R^1R^2R^3SiO_{1/2})_a(R^4R^5SiO_{2/2})_b(R^6SiO_{3/2})_c(SiO_{4/2})_d$ [Formula 1]

$(R^7R^8R^9SiO_{1/2})_e(R^{10}R^{11}SiO)_f(R^{12}SiO_{3/2})_g(SiO_{4/2})_h$ [Formula 2]

[Formula 3]

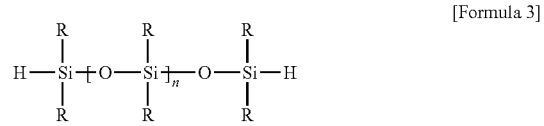

wherein $R^1$ to $R^{12}$ each independently represent an alkoxy group, a hydroxy group, an epoxy group or a monovalent hydrocarbon group, with the provision that at least one of $R^1$ to $R^6$ is an alkenyl group and at least one of $R^7$ to $R^{12}$ is an alkenyl group; R's independently represent hydrogen, an epoxy group or a monovalent hydrocarbon group; a is in a range of 0 to 0.5, b is in a range of 0.5 to 0.98, c is in a range of 0 to 0.2, d is in a range of 0 to 0.1, e is in a range of 0 to 0.5, f is in a range of 0 to 0.3, g is in a range of 0.3 to 0.85, h is in a range of 0 to 0.2, n is in a range of 1 to 10, with the provision that a+b+c+d is 1 and e+f+g+h is 1.

The curable composition may be cured through the reaction of the alkenyl group bound to a silicon atom of the linear organosiloxane compound of the polymerized product (A) and the crosslinked organosiloxane compound (B) with the hydrogen atom bound to a silicon atom of compound (C). The curable composition shows excellent processability and workability, and may provide a cured product thereof that has excellent crack resistance, hardness, thermal shock resistance and adhesive strength. The curable composition shows excellent long-term reliability even under severe conditions such as high-temperature and/or high-moisture conditions. The curable composition does not cause turbidity or surface stickiness under these severe conditions.

The curable composition includes the polymerized product (A) including the linear organosiloxane compound represented by the average composition formula of Formula 1. In this specification, an organosiloxane compound represented by a certain average composition formula may mean cases where the compound comprises a single component that is represented by the certain average composition formula, as well as cases where the compound includes a mixture of at least two components and an average composition of the two components is represented by the certain average composition formula.

In the average composition formula of Formula 1, $R^1$ to $R^6$ are substituents directly bound to a silicon atom, and independently represent an alkoxy group, a hydroxy group, an epoxy group or a monovalent hydrocarbon group. In the above, examples of the monovalent hydrocarbon group may include an alkyl group, a halogenated alkyl group, an alkenyl group, an aryl group and an arylalkyl group. In the above, the alkoxy group or the monovalent hydrocarbon group may be substituted with a suitable substituent, if necessary.

In the average composition formula, the alkoxy group may be a linear, branched or cyclic alkoxy group having 1 to 12 carbon atoms, preferably 1 to 8 carbon atoms, and more preferably 1 to 4 carbon atoms, and may preferably include a methoxy group, an ethoxy group or a propoxy group.

In the average composition formula, the alkyl group or the halogenated alkyl group may be a linear, branched or cyclic alkyl group or halogenated alkyl group having 1 to 12 carbon atoms, preferably 1 to 8 carbon atoms, and more preferably 1 to 4 carbon atoms, and may preferably include a methyl group, an ethyl group, a propyl group, a chloromethyl group, a 3-chloropropyl group or a 3,3,3-trifluoropropyl group, while a methyl group is more preferred.

Also in the average composition formula, the alkenyl group may be an alkenyl group having 2 to 12 carbon atoms, preferably 2 to 8 carbon atoms, and more preferably 2 to 4 carbon atoms, and may preferably include a vinyl group, an allyl group, a butenyl group, a pentenyl group or a hexenyl group, while a vinyl group is more preferred.

Also in the average composition formula, the aryl group may be an aryl group having 6 to 18 carbon atoms, and preferably 6 to 12 carbon atoms, and may preferably include a phenyl group, a tolyl group, a xylyl group and a naphthyl group, while a phenyl group is more preferred.

Also in the average composition formula, the arylalkyl group may be an arylalkyl group having 6 to 19 carbon atoms, and preferably 6 to 13 carbon atoms, and may preferably include a benzyl group or a phenethyl group.

In Formula 1, at least one of $R^1$ to $R^6$ is an alkenyl group. Specifically, the alkenyl group may be included in such an amount that the molar ratio (Ak/Si) of the alkenyl group (Ak) bound to a silicon atom with respect to the total silicon atoms (Si) in the linear organosiloxane compound in the polymerized product (A) is in a range of 0.02 to 0.2, preferably 0.02 to 0.15. If the molar ratio (Ak/Si) is not less than 0.02, it is possible to suitably maintain reactivity with the component (C), and prevent components that have not reacted from bleeding on the surface of the cured product. Also, if the molar ratio (Ak/Si) is not more than 0.2, it is possible to maintain excellent crack resistance of the cured product.

Also, in Formula 1, at least one of $R^1$ to $R^6$ may be an aryl group, preferably a phenyl group. Therefore, the refractive index and hardness characteristics of the cured product may be effectively controlled. Specifically, the aryl group, preferably the phenyl group, may be included in such an amount that the molar ratio (Ar/Si) of the aryl group (Ar) with respect to the total silicon atoms (Si) in the linear organosiloxane compound in the polymerized product (A) is in a range of 0.3 to 1.3, preferably 0.4 to 1.3, and more preferably 0.6 to 1.3. If the molar ratio (Ar/Si) is not less than 0.3, it is possible to optimize the refractive index and hardness of the cured product, and if the molar ratio (Ar/Si) is not more than 1.3, it is possible to optimize viscosity of the composition.

In the above, a, b, c and d in the average composition formula of Formula 1 may represent molar ratios of the siloxane units, respectively, and the total sum of a, b, c and d is 1; a is in a range of 0 to 0.5, b is in a range of 0.5 to 0.98, c is in a range of 0 to 0.2, and d is in a range of 0 to 0.1. In order to optimize the crack resistance of the cured product, (a+b)/(a+b+c+d) may be controlled to be greater than 0.9, preferably greater than 0.95. For example, the upper limit of (a+b)/(a+b+c+d) may be 1.

In the above, the polymerized product (A) may have a viscosity at 25° C. of 1,000 mPa·s to 100,000 mPa·s, preferably 1,000 mPa·s to 50,000 mPa·s. If the viscosity falls within the range, it is possible to maintain excellent processability and workability of the composition before curing and to optimize hardness of the composition after curing.

The linear siloxane compound included in the polymerized product (A) or the product (A) may have a weight average molecular weight ($M_w$) of, for example, 1,000 to 50,000, preferably 1,000 to 30,000. If the $M_w$ of the organosiloxane compound (A) is not less than 1,000, it is possible to provide a composition that shows an appropriate viscosity and has excellent intensity and crack resistance after curing. Also, if the molecular weight ($M_w$) is not more than 50,000, it is possible to optimize viscosity of the composition, thereby maintaining excellent workability and processability. In this specification, the term "weight average molecular weight" or "$M_w$" may refer to a value converted with respect to standard polystyrene and measured by gel permeation chromatography (GPC). Also, unless stated otherwise, the term "molecular weight" means a weight average molecular weight hereinafter.

In one embodiment, an organosiloxane compound represented by the formulas below may be used as the linear organosiloxane compound, but not limited thereto.

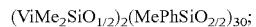

$(ViMe_2SiO_{1/2})_2(MePhSiO_{2/2})_{30};$

$(ViMe_2SiO_{1/2})_2(Ph_2SiO_{2/2})_{10}(Me_2SiO_{2/2})_{10};$

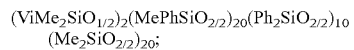

$(ViMe_2SiO_{1/2})_2(MePhSiO_{2/2})_{20}(Ph_2SiO_{2/2})_{10}(Me_2SiO_{2/2})_{20};$

$(ViMe_2SiO_{1/2})_2(MePhSiO_{2/2})_{50}(Me_2SiO_{2/2})_{10};$

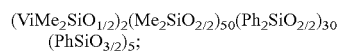

$(ViMe_2SiO_{1/2})_2(Me_2SiO_{2/2})_{50}(Ph_2SiO_{2/2})_{30}(PhSiO_{3/2})_5;$

$(ViMe_2SiO_{1/2})_2(ViMeSiO_{2/2})_2(Me_2SiO_{2/2})_{30}(Ph_2SiO_{2/2})_{30}.$

In the formulas, "Vi" represents a vinyl group, "Me" represents a methyl group, and "Ph" represents a phenyl group.

The linear organosiloxane in the product (A) or the product (A) may include at least one difunctional siloxane unit represented by Formula 5 and at least one difunctional siloxane unit represented by Formula 6.

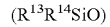

$(R^{13}R^{14}SiO)$  [Formula 5]

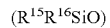

$(R^{15}R^{16}SiO)$  [Formula 6]

wherein $R^{13}$ and $R^{14}$ independently represent an alkyl group, and $R^{15}$ and $R^{16}$ independently represent an aryl group. In Formulas 5 and 6, specific examples of the alkyl and aryl groups may be the same as in Formula 1

In one embodiment, the molar ratio ($100 \times D_6/D$) of the difunctional siloxane unit ($D_6$) of Formula 6 with respect to the total difunctional siloxane units (D) in the organosiloxane compound (A) may be 30% or more. The molar ratio ($100 \times D_6/D$) may also be in the range from 30% to 65% or from 30% to 60%. If the molar ratio ($100 \times D_6/D$) is 30% or more, it may be possible to provide the cured product capable of preventing tackiness on the surface from being generated and having excellent mechanical strength, water and gas transmission properties, and long-term reliability even under high-temperature and/or high-moisture conditions.

The polymerized product (A) may include low-molecular weight cyclic compounds. The term "low-molecular weight cyclic compound" used herein may refer to a cyclic compound, of which the molecular weight is not more than 800, not more than 750 or not more than 700. The cyclic compound may be represented by Formula 7 below.

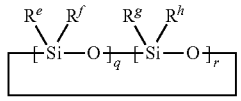
[Formula 7]

wherein $R^e$ and $R^f$ independently represent an alkyl group, $R^g$ and $R^h$ independently represent an aryl group, q is 0 or a positive number, r is 0 or a positive number, and g+r is in a range from 3 to 10, from 3 to 9, from 3 to 8, from 3 to 7 or from 3 to 6. In Formula 7, specific examples of the alkyl and aryl groups may be the same as in Formula 1.

The product (A) may include the cyclic compounds in an amount of 10 weight % or less, 7 weight % or less, 5 weight % or less or 3 weight % or less. The cyclic compound may be included in the product (A) in an amount of 0 weight % or more, or 1 weight % or more. If the low-molecular weight cyclic compounds are included in an amount of 10 weight % or less, it may be possible to provide the cured product having excellent crack resistance, and long-term reliability even under high-temperature and/or high-moisture conditions. The weight ratio of the cyclic compounds may be controlled by eliminating the cyclic compounds remained in the product (A) after the polymerization process through conventional purification processes.

In one embodiment, the polymerized product (A) may be a ring-opening polymerization reaction product of a mixture comprising a cyclic organosiloxane compound. The cyclic organosiloxane compound may be represented by Formula 8 below.

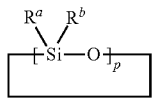
[Formula 8]

wherein $R^a$ and $R^b$ independently represent an alkoxy group, a hydroxy group, an epoxy group or a monovalent hydrocarbon group, and p is in a range from 3 to 9, from 3 to 8, from 3 to 7 or from 3 to 6. In Formula 8, specific examples of the alkoxy and monovalent hydrocarbon groups may be the same as in Formula 1. Also, $R^a$ and $R^b$ may be selected in such a way that the linear organosiloxane compound may be produced.

In one embodiment, the mixture may include at least one compound of Formula 8, in which both of $R^a$ and $R^b$ are alkyl groups, and at least one compound of Formula 8, in which both of $R^a$ and $R^b$ are aryl groups.

The mixture may further include at least one compound represented by Formula 9 below.

$(R^c R^d_2 Si)_2 O$      [Formula 9]

wherein $R^c$ and $R^d$ independently represent an alkoxy group, a hydroxy group, an epoxy group or a monovalent hydrocarbon group. In Formula 9, specific examples of the alkoxy and monovalent hydrocarbon groups may be the same as in Formula 1. Also, $R^c$ and $R^d$ may be selected in such a way that the linear organosiloxane compound may be produced.

In the above mixture, the specific kinds of substituents, the weight ratio of components, and the like may be selected in such a way that the linear organosiloxane compound may be produced.

The ring-opening polymerization may be performed in the presence of a suitable catalyst. Therefore, the mixture may further include at least one catalyst.

As the catalyst, a base catalyst may be used. Suitable catalysts may be metal hydroxides such as KOH, NaOH or CsOH; metal silanolates including an alkali metal compound and a siloxane compound; or quaternary ammonium compounds such as tetramethylammonium hydroxide, tetraethylammonium hydroxide or tetrapropylammonium hydroxide, but not limited thereto.

The weight ratio of the catalyst in the mixture may be suitably controlled considering reactivity, and the like. For example, the catalyst may be included in the mixture in an amount of 0.01 to 30 parts by weight or 0.03 to 5 parts by weight, relative to 100 parts by weight of the total reactants.

In one embodiment, the ring-opening polymerization may be performed in suitable solvents. The specific kinds of the solvents are not particularly limited, but may be selected so as for the reactants such as the cyclic organosiloxane compound and the catalyst to be uniformly mixed and so as not to adversely affect the reactivity.

The polymerization may be performed in the temperature from 0° C. to 150° C. or from 30° C. to 130° C. The polymerization may be performed for 1 hour to 3 days.

The curable composition includes the crosslinked organosiloxane compound (B) that is represented by an average composition formula of Formula 2. The term "crosslinked organosiloxane compound" used herein refers to a siloxane compound that essentially includes a siloxane unit represented by $(RSiO_{1.5})$ or $(SiO_2)$. In the above, R may be an alkoxy group, a hydroxy group, an epoxy group or a monovalent hydrocarbon group as described in Formula 1.

The crosslinked organosiloxane compound (B) may be represented by the average composition formula of Formula 2. In the above, $R^7$ to $R^{12}$ represent substituents directly bound to a silicon atom, and each independently represent an alkoxy, a hydroxy, an epoxy or a monovalent hydrocarbon group.

Specific examples of the respective substituents may be the same as in Formula 1.

In Formula 2, at least one of $R^7$ to $R^{12}$ is an alkenyl group. Particularly, the alkenyl group may be included in such an amount that the molar ratio (Ak/Si) of the alkenyl group (Ak) bound to a silicon atom with respect to the total silicon atoms (Si) in the compound (B) is in a range of 0.15 to 0.35, preferably in a range of 0.15 to 0.3. If the molar ratio (Ak/Si) is not less than 0.15, it is possible to optimize reactivity with the component (C) and to prevent components that have not reacted from bleeding on the surface of the cured product. Also, if the molar ratio (Ak/Si) is not more than 0.35, it is possible to optimize excellent hardness, crack resistance and thermal shock resistance of the cured product.

Also, in Formula 2, at least one of $R^7$ to $R^{12}$ may be an aryl group, preferably a phenyl group. Therefore, it is possible to optimize the refractive index and hardness of the cured product. Particularly, the aryl group, preferably the phenyl group, may be included in such an amount that the molar ratio (Ar/Si) of the aryl group (Ar) with respect to the total silicon atoms (Si) in the organosiloxane compound (B) is in a range of 0.35 to 1.2, preferably in a range of 0.5 to 1.1. If the molar ratio (Ak/Si) is not less than 0.35, it is possible to optimize the refractive index and hardness of the cured product. Also, if the molar ratio (Ak/Si) is not more than 1.2, it is possible to maintain an appropriate viscosity and thermal shock resistance of the composition.

In the above, e, f, g and h in the average composition formula of Formula 2 may represent molar ratios of the siloxane units, respectively, and the total sum of e, f, g and h is 1; e is in a range of 0 to 0.5, f is in a range of 0 to 0.3, g is in a range of 0.35 to 0.85, and h is in a range of 0 to 0.2. In order to maximize the hardness, crack resistance and thermal shock resistance of the cured product, (g+(4/3)h)/(e+2f) may be controlled to be within a range of 2 to 5, preferably a range of 2 to 4, and g/(g+h) may be controlled to be greater than 0.85, preferably greater than 0.90. For example, the upper limit of g/(g+h) may be 1.

The crosslinked organosiloxane compound (B) may have a viscosity at 25° C. of 5,000 mPa·s or more, preferably 10,000 mPa·s or more. Therefore, it is possible to maintain appropriate processability before curing and hardness after the curing.

The crosslinked organosiloxane (B) may have a molecular weight of, for example, 1,000 to 5,000, preferably 1,000 to 4,000. If the molecular weight of the organosiloxane compound (B) is not less than 1,000, it is possible to optimize formability of the composition before curing and hardness of the composition after curing, whereas if the molecular weight of the organosiloxane compound (B) is not more than 5,000, it is possible to optimize properties such as viscosity.

In one embodiment, an organosiloxane compound represented by one selected from the group consisting of the following formulas may be used as the organosiloxane compound (B), but not limited thereto:

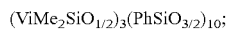

(ViMe$_2$SiO$_{1/2}$)$_3$(PhSiO$_{3/2}$)$_{10}$;

(ViMe$_2$SiO$_{1/2}$)$_2$(MePhSiO$_{2/2}$)$_2$(PhSiO$_{3/2}$)$_{15}$;

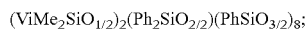

(ViMe$_2$SiO$_{1/2}$)$_2$(Ph$_2$SiO$_{2/2}$)(PhSiO$_{3/2}$)$_8$;

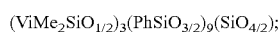

(ViMe$_2$SiO$_{1/2}$)$_3$(PhSiO$_{3/2}$)$_9$(SiO$_{4/2}$);

(ViMe$_2$SiO$_{1/2}$)$_3$(MePhSiO$_{2/2}$)(PhSiO$_{3/2}$)$_9$(SiO$_{4/2}$);

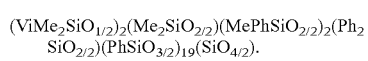

(ViMe$_2$SiO$_{1/2}$)$_2$(Me$_2$SiO$_{2/2}$)(MePhSiO$_{2/2}$)$_2$(Ph$_2$SiO$_{2/2}$)(PhSiO$_{3/2}$)$_{19}$(SiO$_{4/2}$).

In the formulae, "Vi" represents a vinyl group, "Me" represents a methyl group, and "Ph" represents a phenyl group.

The crosslinked organosiloxane compound (B) may be prepared by methods conventionally known in the art. For example, the organosiloxane compound (B) may be prepared by hydrolyzing and condensing one or more organosilanes having a hydrolyzable group such as a halogen atom or an alkoxy group. For example, the hydrolysis and condensation may be performed in the presence of a typical acid catalyst or a base catalyst. Also, examples of the organosilanes used for the hydrolysis and condensation may include compounds represented by R$_n$SiX$_{(4-n)}$. In the formula, X is a hydrolyzable group, and may include a halogen such as chlorine or an alkoxy group, and n may be an integer ranging from 0 to 3. Also in the formula, R is a substituent bound to a silicon atom and may be suitably selected in consideration of the substituent of a desired compound. Also, the linear siloxane compound may be prepared by a ring-opening reaction of cyclic siloxane in the presence of a base catalyst. A variety of methods for preparing a siloxane compound, including the methods as described above, have been known in the art, and a desired organosiloxane compound may be prepared by a person skilled in the art by suitably using one of such methods.

The crosslinked organosiloxane compound (B) may be included in an amount of 50 parts by weight to 700 parts by weight, preferably 50 parts by weight to 500 parts by weight, relative to 100 parts by weight of the linear organosiloxane compound included in the polymerized product (A). In this specification, the unit "part(s) by weight" means a weight ratio. When the weight ratio of compound (B) is controlled to be 50 parts by weight or more, it is possible to maintain excellent hardness of the cured product, whereas when the weight ratio of compound (B) is controlled to be 700 parts by weight or less, it is possible to maintain excellent crack resistance and thermal shock resistance of the cured product.

The curable composition includes the hydrogen siloxane compound (C) represented by Formula 3. The siloxane compound (C) includes at least one hydrogen atom directly bound to a silicon atom. The hydrogen atom may react with the alkenyl group bound to a silicon atom in the linear organosiloxane compound included in the polymerized product (A) and the crosslinked organosiloxane compound (B).

In the compounds of Formula 3, R's may represent independently hydrogen, an epoxy group or a monovalent hydrocarbon group.

In the above, specific examples of the monovalent hydrocarbon group may be the same as described above.

The siloxane compound (C) has a molecular chain, both terminal ends of which are blocked by a hydrogen atom bound to a silicon atom. In this case, at least one of the R's included in the molecular side chain may be hydrogen, if necessary. Particularly, a molar ratio (H/Si) of the hydrogen atom (H) bound to a silicon atom with respect to the total silicon atoms (Si) in the compound (C) may be in a range of 0.2 to 0.8, preferably in a range of 0.3 to 0.75. If the molar ratio is not less than 0.2, it is possible to maintain excellent curability of the composition, whereas if the molar ratio is not more than 0.8, it is possible to maintain excellent crack resistance and thermal shock resistance of the composition.

Also, at least one of the R's in Formula 3 may be an aryl group, preferably a phenyl group. Therefore, the refractive index and hardness of the cured product may be optimized. Specifically, the aryl group, preferably the phenyl group, may be included in such an amount that a molar ratio (Ar/Si) of the aryl group (Ar) with respect to the total silicon atoms (Si) in the compound (C) is in a range from 0.3 to 1, from 0.3 to 0.95, from 0.3 to 0.9, from 0.3 to 0.85, from 0.3 to 0.8 or from 0.4 to 0.8. By controlling the molar ratio (Ar/Si) to be 0.3 or more, it is possible to optimize a refractive index and hardness of the cured product. Also, by controlling the molar ratio (Ar/Si) to be 1 or less, it is possible to optimize viscosity and crack resistance of the composition.

In Formula 3, n may be in a range of 1 to 10, in a range of 1 to 5, in a range of 1 to 4, in a range of 1 to 3, or in a range of 1 to 2. Therefore, it is possible to maintain excellent hardness and crack resistance of the cured product.

In the above, the siloxane compound (C) may have a viscosity at 25° C. of 300 mPa·s or less, preferably 300 mPa·s or less. By controlling the viscosity of the compound (C) to fall within the ranges as described above, it is possible to maintain excellent processability of the composition and excellent hardness of the cured product.

In one embodiment, the siloxane compound (C) may also have a molecular weight of, for example, less than 1,000, preferably less than 800. If the molecular weight of the compound (C) is 1,000 or more, the intensity of the cured product may be deteriorated. A lower limit of the molecular weight of the compound (C) is not particularly limited, but may be, for example, 250.

In one embodiment, a siloxane compound that is represented by at least one selected from the group consisting of the Formulas below may be used as the siloxane compound (C), but is not limited thereto:

(HMe$_2$SiO$_{1/2}$)$_2$(MePhSiO$_{2/2}$)$_2$;

(HMe$_2$SiO$_{1/2}$)$_2$(Ph$_2$SiO$_{2/2}$)$_{1.5}$;

(HMe$_2$SiO$_{1/2}$)$_2$(MePhSiO$_{2/2}$)$_{1.5}$(Ph$_2$SiO$_{2/2}$)$_{1.5}$;

(HMe$_2$SiO$_{1/2}$)$_2$(Me$_2$SiO$_{2/2}$)$_{2.5}$(Ph$_2$SiO$_{2/2}$)$_{2.5}$;

(HMe$_2$SiO$_{1/2}$)$_2$(Me$_2$SiO$_{2/2}$)$_{1.5}$(Ph$_2$SiO$_{2/2}$)$_{2.5}$;

(HMe$_2$SiO$_{1/2}$)$_2$(HMeSiO$_{1/2}$)(Ph$_2$SiO$_{2/2}$)$_2$.

In the formulae, "Vi" represents a vinyl group, "Me" represents a methyl group, and "Ph" represents a phenyl group.

In the above, a method for preparing compound (C) is not particularly limited, and may be, for example, applied in the same manner as in the compound (B) or the linear organosiloxane compound in the product (A).

In the above, an amount of the compound (C) may be controlled for the hydrogen atom bound to a silicon atom in compound (C) to satisfy a certain molar ratio with respect to the total alkenyl groups bound to a silicon atom included in the linear organosiloxane compound of the polymerized product (A) and the crosslinked organosiloxane compound (B). Particularly, in one embodiment, the molar ratio (H/Ak) of the hydrogen atom (H) bound to a silicon atom included in compound (C) with respect to the total alkenyl groups (Ak) bound to a silicon atom included in the linear organosiloxane compound of the polymerized product (A) and the crosslinked organosiloxane compound (B) may be in a range of 0.8 to 1.2, preferably in a range of 0.85 to 1.15, and more preferably in a range of 0.9 to 1.1. By controlling the molar ratio (H/Ak) as described above, a composition, which shows excellent processability and workability before curing, which shows excellent crack resistance, hardness, thermal shock resistance and adhesive strength after curing, and which prevents turbidity and tackiness on the surface from being generated under severe conditions may be provided.

As a weight ratio, the siloxane compound (C) may be included in an amount of 50 parts by weight to 500 parts by weight, preferably in a range of 50 parts by weight to 400 parts by weight, relative to 100 parts by weight of the linear organosiloxane compound in the polymerized product (A).

Considering the refractive index and hardness, all of the linear organosiloxane compound of the product (A), crosslinked organosiloxane compound (B) and compound (C) may include at least one aryl group that is bound to a silicon atom thereof respectively. Examples of the aryl group may include a phenyl group. In cases where all of the above compounds include at least one aryl group, the molar ratio (Ar/Si) of the total aryl groups (Ar) bound to a silicon atom included in the above compounds with respect to the total silicon atoms (Si) included in the above compounds may be preferably greater than 0.3 and 1.2 or less, and more preferably may be in a range of 0.4 to 1.2. By controlling the molar ratio to exceed 0.3, it is possible to maintain excellent hardness and refractive index of the cured product. Also, by controlling the molar ratio to be 1.2 or less, the viscosity of the composition may be effectively controlled.

In the case where all of the above compounds include at least one aryl group, it is preferable for the curable composition to satisfy Equations 1 and 2:

$$|X_{(A)} - X_{(B)}| < 0.4 \quad \text{[Equation 1]}$$

$$|X_{(B)} - X_{(C)}| < 0.4 \quad \text{[Equation 2]}$$

wherein X$_{(A)}$ represents a molar ratio of an aryl group bound to the silicon atoms included in the linear organosiloxane compound in the product (A) with respect to the total silicon atoms in the linear organosiloxane compound in the product (A), X$_{(B)}$ represents a molar ratio of an aryl group bound to the silicon atoms included in the compound (B) with respect to the total silicon atoms in the compound (B), and X$_{(C)}$ represents a molar ratio of an aryl group bound to the silicon atoms included in the compound (C) with respect to the total silicon atoms in the compound (C).

In Equations 1 and 2, |X$_{(A)}$−X$_{(B)}$| and |X$_{(B)}$−X$_{(C)}$| mean an absolute value of the difference between X$_{(A)}$ and X$_{(B)}$ and an absolute value of the difference between X$_{(B)}$ and X$_{(C)}$, respectively. Here, each of the absolute values may preferably be less than 0.35. Also, the lower limits of the absolute values are not particularly limited.

If a molar ratio of the aryl group satisfies the requirements of Equations 1 and 2, it is possible to provide a composition showing excellent compatibility between components which constitute the composition and have excellent processability and workability before curing, and to provide a composition which may show excellent refractive index, optical transmittance and hardness after curing.

The curable composition may further include a hydrosilylation catalyst. The hydrosilylation catalyst may be used to facilitate the reaction of the hydrogen atom bound to a silicon atom with the alkenyl groups. Kinds of the hydrosilylation catalyst that may be used herein are not particularly limited, and any hydrosilylation catalysts that are known in the art may be used. Examples of such a catalyst may include a platinum, palladium or rhodium catalyst. In one embodiment, the platinum catalyst may be used in consideration of catalytic efficiency, etc. Examples of such a catalyst may include, but are not limited to, chloroplatinic acid, platinum tetrachloride, an olefin complex of platinum, an alkenyl siloxane complex of platinum or a carbonyl complex of platinum, etc.

In the above, an amount of the hydrosilylation catalyst is not particularly limited, as long as the hydrosilylation catalyst is present in a so-called catalytic amount, i.e. an amount in which hydrosilylation catalyst may act as a catalyst. Typically, the hydrosilylation catalyst may be included in an amount of 0.1 ppm to 500 ppm, preferably 0.2 ppm to 100 ppm, based on the atomic weight of platinum, palladium or rhodium.

Also, the curable composition may further include a tackifier in order to further improve adhesive strength to various bases. The tackifier may improve self-adhesive strength to a composition or cured product, and particularly may improve self-adhesive strength to a metal and an organic resin.

Examples of the tackifier usable herein may include, but are not limited to, a silane having at least one functional group, preferably at least two functional groups, selected from the group consisting of an alkenyl group such as a vinyl group, a (meth)acryloyloxy group, a hydrosilyl group (a SiH group), an epoxy group, an alkoxy group, an alkoxysilyl group, a carbonyl group and a phenyl group; or an organic silicon compound such as cyclic or linear siloxanes having 2 to 30 silicon atoms, preferably 4 to 20 silicon atoms. The tackifier may be used alone or in combinations thereof.

If the tackifier is included in the composition, an amount of the tackifier may be in a range of 0.1 parts by weight to 20 parts by weight, relative to 100 parts by weight of the linear organosiloxane compound of the polymerized product (A), but may be suitably varied in consideration of the desired improvement of the adhesive strength.

Along with the components as described above, the curable composition may optionally further include at least one additive selected from the group consisting of a reaction inhibitor such as 2-methyl-3-butyn-2-ol, 2-phenyl-3-1-butin-2-ol, 3-methyl-3-penten-1-in, 3,5-dimethyl-3-hexen-1-in, 1,3,5,7-tetramethyl-1,3,5,7-tetrahexenylcyclotetrasiloxane or ethynylcyclohexane; an inorganic filler such as silica, alumina, zirconia or titania; carbon-functional silane and partially hydrolyzed condensates thereof or a siloxane compound having an epoxy group and/or an alkoxysilyl group; a thixotropic agent such as aerosolized silica usable in combination with polyether; a conductivity-providing agent such as metal powder including silver, copper or aluminum, or various carbon materials; and a color control agent such as a pigment or a dye.

The present application also relates to a semiconductor device that includes a semiconductor element encapsulated by an encapsulant that includes the curable composition as described above in a cured state.

Examples of the semiconductor element which may be encapsulated by the curable composition may include semiconductor elements used in a diode, a transistor, a thyristor, a solid image pickup device, an integral IC and a hybrid IC. Additionally, exemplary examples of the semiconductor device may include a diode, a transistor, a thyristor, a photocoupler, CCD, an integral IC, a hybrid IC, LSI, VLSI and a light-emitting diode (LED).

In one embodiment, the semiconductor device may be a light-emitting diode that includes a light-emitting element that is encapsulated by an encapsulant that includes the curable composition as described above in a cured state.

Kinds of the light-emitting element usable herein are not particularly limited. For example, a light-emitting element formed by laminating a semiconductor material on a substrate may be used. In this case, examples of the semiconductor material may include, but are not limited to, GaAs, GaP, GaAlAs, GaAsP, AlGaInP, GaN, InN, AlN, InGaIN or SiC. Also, examples of the substrate used herein may include sapphire, spinel, SiC, Si, ZnO or GaN single crystals.

In one embodiment, a buffer layer may also be formed between the substrate and the semiconductor material, if necessary. In this case, a GaN or AlN may be used as the buffer layer. A method of laminating a semiconductor material on a substrate is not particularly limited, but may include, for example, an MOCVD, HDVPE or a liquid phase epitaxy method. In the above, a structure of the light-emitting element may include, for example, a monojunction structure, a heterojunction structure and a double heterojunction structure having an MIS junction, a PN junction, or a PIN junction. Also, the light-emitting element may be formed in a single or multiple quantum well structure.

In one embodiment, an emission wavelength of the light-emitting element may be, for example, in a range of 250 nm to 550 nm, preferably in a range of 300 nm to 500 nm, and more preferably in a range of 330 nm to 470 nm. The emission wavelength represents a peak emission wavelength. When the emission wavelength of the light-emitting element falls within this wavelength, it is possible to obtain a white light-emitting element having a longer life span and showing high energy efficiency and color reproduction.

The light-emitting diode may be manufactured by encapsulating a light-emitting element, particularly a light-emitting element having an emission wavelength of 250 nm to 550 nm, with an encapsulating material including the curable composition as described above. In this case, the encapsulation of the light-emitting element may be performed using only the curable composition as described above, and may be performed in combination with another encapsulant, if necessary. When at least two encapsulants are used together, a light-emitting element may be encapsulated with the curable composition as described above, followed by encapsulating the primarily encapsulated light-emitting element with another encapsulant, or may be encapsulated with another encapsulant, followed by encapsulating the primarily encapsulated light-emitting element with the curable composition as described above. The other encapsulant which may be used herein may include an epoxy resin, a silicone resin, an acryl resin, a urea resin, an imide resin or glass.

For example, a method of encapsulating a light-emitting element with the curable composition as described above includes a method of first injecting the curable composition as described above into a mold-type cast, soaking a lead frame, in which a light-emitting element is fixed, in the curable composition as described above and curing the curable composition; a method of injecting the curable composition as described above into a cast to which a light-emitting element is inserted and curing the curable composition; etc. In this case, examples of the method of injecting the curable composition may include injection using a dispenser, transfer molding, injection molding, etc. Also, other encapsulation methods used herein may include a method of applying the curable composition as described above onto a light-emitting device and curing the curable composition by means of a dropping, stencil printing, screen printing or a mask process, a method of injecting the curable composition in a cup having a light-emitting element disposed therein using a dispenser and curing the curable composition, etc. Also, the curable composition as described above may be used as a die-bond material for fixing a light-emitting element in a lead terminal or a package, a passivation film on a light-emitting device, a package substrate, etc.

The method of curing the curable composition as described above is not particularly limited, but may be performed, for example, by heating the composition at a temperature of 60° C. to 200° C. for 10 minutes to 5 hours, and be optionally performed by undergoing at least two steps of the curing at conditions of suitable temperature and time.

A shape of an encapsulated portion is not particularly limited, but may be formed in a shell-type lens, planar or thin-film shape.

In one embodiment, performance of the light-emitting element may also be improved using additional conventionally known methods. Methods of improving the performance may, for example, include a method of installing a light reflective layer or a light-concentrating layer at a rear surface of a light-emitting element, a method of forming a complementarily colored portion at a bottom of a light-emitting element, a method of installing a layer for absorbing light of a wavelength shorter than a main emission peak wavelength on a light-emitting element, a method of encapsulating a light-emitting element and further molding the light-emitting element using a hard material, a method of fixing a light-emitting diode through a through hole, a method of connecting a light-emitting element to a lead member using a flip chip interconnection, thereby extracting light in a direction of a substrate, etc.

The light-emitting diode may be, for example, effectively used as a light source such as a backlight unit of a liquid crystal display device (LCD), various sensors, a printer, or a photocopier, a light source for an automobile dashboard, a traffic light, a pilot lamp, a display device, a light source for a planar luminous body, displays, decorations or various lights.

Advantageous Effects

The curable composition shows excellent processability and workability. Also, the curable composition shows excellent crack resistance, thermal shock resistance and adhesive strength and also has excellent reliability and long-term reliability under high-temperature and/or high-moisture conditions. In addition, the curable composition may provide a cured product, which is capable of preventing turbidity from being generated, and which is capable of preventing tackiness on the surface from being generated, and therefore surface stickiness may be prevented.

BEST MODE

Hereinafter, the present application will be described in further detail referring to Examples designed according to the present application and Comparative Examples that are not designed according to the present application; however, the present application is not limited to Examples.

In Examples, "Vi" represents a vinyl group, "Ph" represents a phenyl group, "Me" represents a methyl group, and "Ep" represents an epoxy group.

1. Measurement of Optical Transmittance

In Examples and Comparative Examples, optical transmittance of cured products was evaluated, as follows. First, a prepared composition was injected between two glass plates which were arranged to be spaced at a distance of approximately 1 mm apart from each other, and cured at a constant temperature of 150° C. for 1 hour to prepare a 1 mm-thick test sample. Then, the test sample was measured at room temperature for optical transmittance in a thickness direction with respect to a wavelength range of 450 nm using a UV-VIS spectrometer, and evaluated according to the following criteria.

<Criteria for Evaluation of Optical Transmittance>
○: Optical transmittance of 98.5% or more
x: Optical transmittance of less than 98.5%

2. Evaluation of Surface Stickiness

A curable composition was injected into a mold, and cured at a constant temperature of 150° C. for 1 hour. Then, surface stickiness was evaluated according to the following criteria by contacting a surface of the resulting cured product with hands.

<Criteria for Evaluation of Surface Stickiness>
○: Surface is hardly sticky
Δ: Surface is slightly sticky
x: Surface is highly sticky 3. Evaluation of Device Properties A 5630 LED package prepared from polyphthalamide (PPA) was used to evaluate device properties. More particularly, a curable composition was dispensed into a polyphthalamide cup, and cured at a constant temperature of 60° C. for 30 minutes, and then at a constant temperature of 150° C. for 1 hour to prepare a surface-mounted LED. Then, the LED was evaluated for thermal shock and long-term reliability under the high-temperature/high-moisture conditions, as follows.

<Criteria for Evaluation of Thermal Shock>

One cycle, in which the prepared surface-mounted LED was left at a constant temperature of −40° C. for 30 minutes, and then was left at a constant temperature of 100° C. for 30 minutes, was repeated 10 times. Then, the surface-mounted LED was cooled at room temperature, and evaluated for a peeling state to determine the thermal shock resistance (Total 10 surface-mounted LED's were prepared in each of Examples and Comparative Examples, and evaluated for a peeling state).

<Long-Term Reliability at High-Temperature/High-Moisture Conditions>

The prepared surface-mounted LED was operated for 100 hours under constant conditions of a temperature of 85° C. and relative moisture of 85% while applying an electric current of 60 mA to the LED. After the completion of the operation, a luminance of the LED was then measured to calculate reduction in luminance with respect to the initial luminance, and the reliability was evaluated according to the following criteria.

<Evaluation Criteria>
○: the case where Luminance is reduced by 10% or less with respect to initial luminance
x: the case where Luminance is reduced by 10% or more with respect to initial luminance 4. Evaluation of the Amount of the Low Molecular Weight Cyclic Compounds The amount of the low molecular weight cyclic compounds in the polymerized product was measured by GPC device available from Water Co.

MODE FOR APPLICATION

Preparation Example 1

50.0 g of octamethylcyclotetrasiloxane, 133.7 g of octaphenylcyclotetrasiloxane, 36.7 g of tetramethyltetraphenylcyclotetrasiloxane and 12.6 g of divinyltetramethyldisiloxane were mixed, and then 0.75 mL of TMAH (tetramethylammonium hydroxide) was added thereto. Then, a ring opening polymerization reaction was performed in a temperature of 110° C. for 15 hours. After the reaction, a ring opening polymerization reaction product including a linear organosiloxane compound represented by Formula 1 was obtained. Then, the low molecular weight cyclic compounds having the molecular weight of 800 were eliminated via a conventional purification process from the ring opening polymerization reaction product so as for the amount of the cyclic compounds to be 13 weight %.

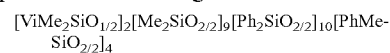 [Formula 1]

Preparation Example 2

50.0 g of octamethylcyclotetrasiloxane, 100.3 g of octaphenylcyclotetrasiloxane, 64.3 g of tetramethyltetraphenylcyclotetrasiloxane and 3.1 g of divinyltetramethyldisiloxane were mixed, and then 0.70 mL of TMAH (tetramethylammonium hydroxide) was added thereto. Then, a ring opening polymerization reaction was performed in a temperature of 110° C. for 15 hours. After the reaction, a ring opening polymerization reaction product including a linear organosiloxane compound represented by Formula 5 was obtained. Then, the low molecular weight cyclic compounds were eliminated via a conventional purification process from the ring opening polymerization reaction product so as for the amount of the cyclic compounds to be 13 weight %.

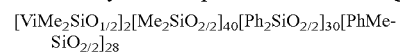 [Formula 5]

Preparation Example 3

8.7 g of tetravinyltetramethylcyclotetrasiloxane, 92.0 g of tetramethyltetraphenylcyclotetrasiloxane and 6.3 g of divinyltetramethyldisiloxane were mixed, and then 0.3 mL of TMAH (tetramethylammonium hydroxide) was added thereto. Then, a ring opening polymerization reaction was performed in a temperature of 90° C. for 15 hours. After the reaction, a ring opening polymerization reaction product including a linear organosiloxane compound represented by Formula 6 was obtained. Then, the low molecular weight cyclic compounds were eliminated via a conventional purification process from the ring opening polymerization reaction product so as for the amount of the cyclic compounds to be 13 weight %.

[ViMe$_2$SiO$_{1/2}$]$_2$[ViMeSiO$_{2/2}$]$_3$[PhMeSiO$_{2/2}$]$_{20}$      [Formula 6]

Preparation Example 4

40.0 g of octamethylcyclotetrasiloxane, 107.0 g of octaphenylcyclotetrasiloxane, 73.5 g of tetramethyltetraphenylcyclotetrasiloxane and 2.5 g of divinyltetramethyldisiloxane were mixed, and then 0.7 mL of TMAH (tetramethylammonium hydroxide) was added thereto. Then, a ring opening polymerization reaction was performed in a temperature of 110° C. for 15 hours. After the reaction, a ring opening polymerization reaction product including a linear organosiloxane compound represented by Formula 7 was obtained. Then, the low molecular weight cyclic compounds were eliminated via a conventional purification process from the ring opening polymerization reaction product so as for the amount of the cyclic compounds to be 13 weight %.

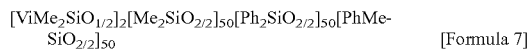
[ViMe$_2$SiO$_{1/2}$]$_2$[Me$_2$SiO$_{2/2}$]$_{50}$[Ph$_2$SiO$_{2/2}$]$_{50}$[PhMeSiO$_{2/2}$]$_{50}$      [Formula 7]

Preparation Example 5

17.1 g of tetravinyltetramethylcyclotetrasiloxane, 90.0 g of tetramethyltetraphenylcyclotetrasiloxane and 6.2 g of divinyltetramethyldisiloxane were mixed, and then 0.4 mL of TMAH (tetramethylammonium hydroxide) was added thereto. Then, a ring opening polymerization reaction was performed in a temperature of 90° C. for 15 hours. After the reaction, a ring opening polymerization reaction product including a linear organosiloxane compound represented by Formula 8 was obtained. Then, the low molecular weight cyclic compounds were eliminated via a conventional purification process from the ring opening polymerization reaction product so as for the amount of the cyclic compounds to be 13 weight %.

[ViMe$_2$SiO$_{1/2}$]$_2$[ViMeSiO$_{2/2}$]$_6$[PhMeSiO$_{2/2}$]$_{20}$      [Formula 8]

Preparation Example 6

A ring opening polymerization reaction product including the linear organosiloxane compound represented by Formula 1 was prepared in the same manner as in Preparation Example 1 except that the purification process was performed so as for the amount of the cyclic compounds to be 6 weight %.

Preparation Example 7

A ring opening polymerization reaction product including the linear organosiloxane compound represented by Formula 5 was prepared in the same manner as in Preparation Example 2 except that the purification process was performed so as for the amount of the cyclic compounds to be 6 weight %.

Preparation Example 8

A ring opening polymerization reaction product including the linear organosiloxane compound represented by Formula 6 was prepared in the same manner as in Preparation Example 3 except that the purification process was performed so as for the amount of the cyclic compounds to be 6 weight %.

Example 1

The ring opening polymerization reaction product prepared in the preparation example 1 was mixed with the compounds which were represented by the Formulas 2 to 4 as described below. The compounds of Formulas 2 to 4 were prepared by methods conventionally known to a person skilled in the art. Therefore, a mixture including a linear organosiloxane compound (Formula 1; molar ratio (hereinafter, referred to as "Ak/Si") of an alkenyl group (Vi) bound to a silicon atom with respect to the total silicon atoms: 0.08), a crosslinked organosiloxane compound (Formula 2; Ak/Si: 0.154) and a hydrogen siloxane compound (Formula 3; molar ratio (hereinafter, referred to as "H/Si") of a hydrogen atom bound to a silicon atom with respect to the total silicon atoms: 0.667), and an tackifier (Formula 4) was obtained. The mixture was prepared so that 100 g of the linear organosiloxane compound (Formula 1), 50 g of the crosslinked organosiloxane compound (Formula 2), 20.7 g of the hydrogen siloxane compound (Formula 3) and 3.5 g of the tackifier (Formula 4) might be presented (in such an amount that the molar ratio (hereinafter, referred to as "H/Ak") of a hydrogen atom bound to a silicon atom in the hydrogen siloxane compound with respect to an alkenyl group (Vi) bound to a silicon atom in the linear and crosslinked organosiloxane compound is 1.0). Then, a catalyst (platinum(0)-1,3-divinyl-1,1,3,3-tetramethyldisiloxane) was mixed in such an amount that the content of Pt(0) in the resulting mixture was 10 ppm, homogeneously mixed, and degassed to prepare a curable composition.

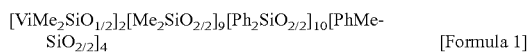
[ViMe$_2$SiO$_{1/2}$]$_2$[Me$_2$SiO$_{2/2}$]$_9$[Ph$_2$SiO$_{2/2}$]$_{10}$[PhMeSiO$_{2/2}$]$_4$      [Formula 1]

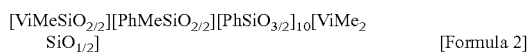
[ViMeSiO$_{2/2}$][PhMeSiO$_{2/2}$][PhSiO$_{3/2}$]$_{10}$[ViMe$_2$SiO$_{1/2}$]      [Formula 2]

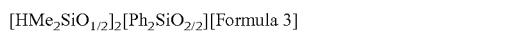
[HMe$_2$SiO$_{1/2}$]$_2$[Ph$_2$SiO$_{2/2}$]      [Formula 3]

[ViMe$_2$SiO$_{1/2}$]$_2$[EpSiO$_{3/2}$]$_2$[PhMeSiO$_{2/2}$]$_{10}$      [Formula 4]

Example 2

A curable composition was prepared in the same manner as in Example 1, except that the mixture was prepared so that 100 g of the linear organosiloxane compound of Formula 1, 100 g of the crosslinked organosiloxane compound of Formula 2, 31.2 g of the hydrogen siloxane compound of Formula 3, and 4.7 g of the tackifier of Formula 4 might be mixed together (in such an amount that the molar ratio H/Ak was 1.0).

Example 3

A curable composition was prepared in the same manner as in Example 1, except that the mixture was prepared so that 100 g of the linear organosiloxane compound of Formula 1, 300 g of the crosslinked organosiloxane compound of Formula 2, 73.3 g of the hydrogen siloxane compound of Formula 3, and 9.7 g of the tackifier of Formula 4 might be mixed together (in such an amount that the molar ratio H/Ak was 1.0).

Example 4

A curable composition was prepared in the same manner as in Example 1, except that the mixture was prepared so that 100 g of the linear organosiloxane compound of Formula 1, 700 g of the crosslinked organosiloxane compound of Formula 2, 157.2 g of the hydrogen siloxane compound of Formula 3, and 19.6 g of the tackifier of Formula 4 might be mixed together (in such an amount that the molar ratio H/Ak was 1.0).

Example 5

A curable composition was prepared in the same manner as in Example 1, except that the reaction product of Preparation Example 2 was used instead of the reaction product of Preparation Example 1, and the mixture was prepared so that 100 g of a compound (Ak/Si: 0.02) which was represented by the Formula 5 and which was a linear organosiloxane compound, 50 g of the crosslinked organosiloxane compound of Formula 2, 13.5 g of the hydrogen siloxane compound of Formula 3, and 3.4 g of the tackifier of Formula 4 might be mixed together (in such an amount that the molar ratio H/Ak was 1.0).

$$[ViMe_2SiO_{1/2}]_2[Me_2SiO_{2/2}]_{40}[Ph_2SiO_{2/2}]_{30}[PhMeSiO_{2/2}]_{28} \quad \text{[Formula 5]}$$

Example 6

A curable composition was prepared in the same manner as in Example 1, except that the mixture was prepared so that 100 g of the linear organosiloxane compound of Formula 5, 100 g of the crosslinked organosiloxane compound of Formula 2, 23.9 g of the hydrogen siloxane compound of Formula 3, and 4.6 g of the tackifier of Formula 4 might be mixed together (in such an amount that the molar ratio H/Ak was 1.0).

Example 7

A curable composition was prepared in the same manner as in Example 1, except that the mixture was prepared so that 100 g of the linear organosiloxane compound of Formula 5, 300 g of the crosslinked organosiloxane compound of Formula 2, 64.1 g of the hydrogen siloxane compound of Formula 3, and 9.5 g of the tackifier of Formula 4 might be mixed together (in such an amount that the molar ratio H/Ak was 1.0).

Example 8

A curable composition was prepared in the same manner as in Example 1, except that the mixture was prepared so that 100 g of the linear organosiloxane compound of Formula 5, 700 g of the crosslinked organosiloxane compound of Formula 2, 145.2 g of the hydrogen siloxane compound of Formula 3, and 19.2 g of the tackifier of Formula 4 might be mixed together (in such an amount that the molar ratio H/Ak was 1.0).

Example 9

A curable composition was prepared in the same manner as in Example 1, except that the reaction product of Preparation Example 3 was used instead of the reaction product of Preparation Example 1, and the mixture was prepared so that 100 g of a compound (Ak/Si: 0.2) represented by Formula 6 and which was a linear organosiloxane compound, 50 g of the crosslinked organosiloxane compound of Formula 2, 37.2 g of the hydrogen siloxane compound of Formula 3, and 3.9 g of the tackifier of Formula 4 might be mixed together (in such an amount that the molar ratio H/Ak was 1.0).

$$[ViMe_2SiO_{1/2}]_2[ViMeSiO_{2/2}]_3[PhMeSiO_{2/2}]_{20} \quad \text{[Formula 6]}$$

Example 10

A curable composition was prepared in the same manner as in Example 1, except that the mixture was prepared so that 100 g of the linear organosiloxane compound of Formula 6, 100 g of the crosslinked organosiloxane compound of Formula 2, 47.8 g of the hydrogen siloxane compound of Formula 3, and 5.1 g of the tackifier of Formula 4 might be mixed together (in such an amount that the molar ratio H/Ak was 1.0).

Example 11

A curable composition was prepared in the same manner as in Example 1, except that the mixture was prepared so that 100 g of the linear organosiloxane compound of Formula 6, 300 g of the crosslinked organosiloxane compound of Formula 2, 89.7 g of the hydrogen siloxane compound of Formula 3, and 10.0 g of the tackifier of Formula 4 might be mixed together (in such an amount that the molar ratio H/Ak was 1.0).

Example 12

A curable composition was prepared in the same manner as in Example 1, except that the mixture was prepared so that 100 g of the linear organosiloxane compound of Formula 6, 700 g of the crosslinked organosiloxane compound of Formula 2, 173.6 g of the hydrogen siloxane compound of Formula 3, and 19.8 g of the tackifier of Formula 4 might be mixed together (in such an amount that the molar ratio H/Ak was 1.0).

Example 13

A curable composition was prepared in the same manner as in Example 1, except that the reaction product of Preparation Example 6 was used instead of the reaction product of Preparation Example 1.

Example 14

A curable composition was prepared in the same manner as in Example 5, except that the reaction product of Preparation Example 7 was used instead of the reaction product of Preparation Example 2.

Example 15

A curable composition was prepared in the same manner as in Example 9, except that the reaction product of Preparation Example 8 was used instead of the reaction product of Preparation Example 3.

Comparative Example 1

A curable composition was prepared in the same manner as in Example 1, except that the reaction product of Preparation Example 4 was used instead of the reaction product of Preparation Example 1, and the mixture was prepared so that 100 g of a compound (Ak/Si: 0.013) represented by Formula 7 and which was a linear organosiloxane compound, 300 g of the crosslinked organosiloxane compound of Formula 2, 65.0 g of the hydrogen siloxane compound of Formula 3, and 9.5 g of the tackifier of Formula 4 might be mixed together (in such an amount that the molar ratio H/Ak was 1.0).

$$[ViMe_2SiO_{1/2}]_2[Me_2SiO_{2/2}]_{50}[Ph_2SiO_{2/2}]_{50}[PhMeSiO_{2/2}]_{50} \quad \text{[Formula 7]}$$

Comparative Example 2

A curable composition was prepared in the same manner as in Example 1, except that the reaction product of Preparation Example 5 was used instead of the reaction product of Preparation Example 1, and the mixture was prepared so that 100 g of a compound (Ak/Si: 0.29) represented by Formula 8 that was a linear organosiloxane compound, 300 g of the crosslinked organosiloxane compound of Formula 2, 102.5 g of the hydrogen siloxane compound of Formula 3, and 10.2 g of the tackifier of Formula 4 might be mixed together (in such an amount that the molar ratio H/Ak was 1.0).

$$[ViMe_2SiO_{1/2}]_2[ViMeSiO_{2/2}]_6[PhMeSiO_{2/2}]_{20} \quad \text{[Formula 8]}$$

Comparative Example 3

A curable composition was prepared in the same manner as in Example 1, except that the mixture was prepared so that 100 g of the linear organosiloxane compound of Formula 1, 45 g of the crosslinked organosiloxane compound of Formula 2, 19.8 g of the hydrogen siloxane compound of Formula 3, and 3.4 g of the tackifier of Formula 4 might be mixed together (in such an amount that the molar ratio H/Ak was 1.0).

Comparative Example 4

A curable composition was prepared in the same manner as in Example 1, except that the mixture was prepared so that 100 g of the linear organosiloxane compound of Formula 1, 750 g of the crosslinked organosiloxane compound of Formula 2, 167.8 g of the hydrogen siloxane compound of Formula 3, and 21.0 g of the tackifier of Formula 4 might be mixed together (in such an amount that the molar ratio H/Ak was 1.0).

Comparative Example 5

A curable composition was prepared in the same manner as in Example 1, except that the mixture was prepared so that 100 g of the linear organosiloxane compound of Formula 1, 300 g of the crosslinked organosiloxane compound of Formula 2, 40.0 g of the hydrogen siloxane compound of Formula 3, and 9.0 g of the tackifier of Formula 4 might be mixed together (in such an amount that the molar ratio H/Ak was 0.6).

Comparative Example 6

A curable composition was prepared in the same manner as in Example 1, except that the mixture was prepared so that 100 g of the linear organosiloxane compound of Formula 1, 300 g of the crosslinked organosiloxane compound of Formula 2, 11.5 g of the crosslinked organosiloxane compound of Formula 3, and 150.0 g of the hydrogen siloxane compound of Formula 4 might be mixed together (in such an amount that the molar ratio H/Ak was 1.4).

The evaluation results of the curable compositions are summarized and listed in the following Table 1.

TABLE 1

| | | Optical Transmittance | Surface Stickiness | Thermal Shock Resistance | High-temperature/High-moisture Reliability |
|---|---|---|---|---|---|
| Examples | 1 | ○ | ○ | 2/10 | ○ |
| | 2 | ○ | ○ | 1/10 | ○ |
| | 3 | ○ | ○ | 0/10 | ○ |
| | 4 | ○ | ○ | 1/10 | ○ |
| | 5 | ○ | ○ | 2/10 | ○ |
| | 6 | ○ | ○ | 1/10 | ○ |
| | 7 | ○ | ○ | 0/10 | ○ |
| | 8 | ○ | ○ | 1/10 | ○ |
| | 9 | ○ | ○ | 2/10 | ○ |
| | 10 | ○ | ○ | 0/10 | ○ |
| | 11 | ○ | ○ | 0/10 | ○ |
| | 12 | ○ | ○ | 0/10 | ○ |
| | 13 | ○ | ○ | 0/10 | ○ |
| | 14 | ○ | ○ | 0/10 | ○ |
| | 15 | ○ | ○ | 0/10 | ○ |
| Comparative Examples | 1 | ○ | Δ | 7/10 | x |
| | 2 | ○ | ○ | 7/10 | x |
| | 3 | ○ | x | 10/10 | x |
| | 4 | ○ | ○ | 10/10 | x |
| | 5 | ○ | ○ | 9/10 | x |
| | 6 | ○ | ○ | 9/10 | x |

As seen from Table 1, it was revealed that the curable compositions of Examples designed according to the present application showed excellent optical transmittance after curing without causing surface stickiness. Also, it was revealed that the curable compositions of Examples had excellent thermal shock resistance and showed excellent results in the long-term reliability test under the high-temperature/high-moisture conditions.

Meanwhile, although the other conditions were within the scope of the present application, in the cases of Comparative Examples 1 and 2 in which a linear organosiloxane compound had a low or high molar ratio Ak/Si, the composition showed seriously deteriorated thermal shock resistance and reliability. Also, in the cases of Comparative Examples 3 and 4 in which a weight ratio of the crosslinked organosiloxane compound to the linear organosiloxane compound was low or high, the composition showed seriously deteriorated thermal shock resistance and reliability, and surface stickiness was particularly present in the composition of Comparative Example 3. Also, it was confirmed that the thermal shock resistance and reliability of the composition were seriously deteriorated in the cases of Comparative Examples 5 and 6 in which the molar ratio H/Ak was low or high.

What is claimed is:
1. A curable composition that comprises:
   (A) a polymerized product comprising a linear organosiloxane compound, which is represented by an average composition formula of Formula 1 and, of which a molar ratio of an alkenyl group bound to a silicon atom with respect to the total silicon atoms ranges from 0.02 to 0.2;
   (B) a crosslinked organosiloxane compound, which is represented by an average composition formula of Formula 2, and of which a molar ratio of an alkenyl group bound to a silicon atom with respect to the total silicon atoms ranges from 0.15 to 0.35; and
   (C) a hydrogen siloxane compound, which is represented by Formula 3, and of which a molar ratio of a hydrogen atom bound to a silicon atom with respect to the total silicon atoms ranges from 0.2 to 0.8, the crosslinked organosiloxane compound being comprised in a weight ratio of 50 parts by weight to 700 parts by weight relative to 100 parts by weight of the linear organosiloxane compound, a molar ratio of a hydrogen atom bound to a silicon atom in the siloxane compound with respect to an alkenyl group bound to a silicon atom in the linear and crosslinked organosiloxane compounds ranging from 0.8 to 1.2 and the hydrogen siloxane compound comprising an aryl group in such an amount that a molar ratio (Ar/Si) of the aryl group (Ar) with respect to the total silicon atoms (Si) in the hydrogen siloxane compound is in a range from 0.4 to 0.8:

$(R^1R^2R^3SiO_{1/2})_a(R^4R^5SiO_{2/2})_b(R^6SiO_{3/2})_c(SiO_{4/2})_d$ [Formula 1]

$(R^7R^8R^9SiO_{1/2})_e(R^{10}R^{11}SiO)_f(R^{12}SiO_{3/2})_g(SiO_{4/2})_h$ [Formula 2]

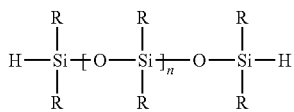 [Formula 3]

wherein $R^1$ to $R^{12}$ independently represent an alkoxy group, a hydroxy group, an epoxy group or a monovalent hydrocarbon group, with the provision that at least one of $R^1$ to $R^6$ is an alkenyl group and at least one of $R^7$ to $R^{12}$ is an alkenyl group; R's independently represent hydrogen, an epoxy group or a monovalent hydrocarbon group; a is in a range of 0 to 0.5, b is in a range of 0.5 to 0.98, c is in a range of 0 to 0.2, d is in a range of 0 to 0.1, e is in a range of 0 to 0.5, f is in a range of 0 to 0.3, g is in a range of 0.3 to 0.85, h is in a range of 0 to 0.2, n is in a range of 1 to 2, with the provision that a+b+c+d is 1 and e+f+g+h is 1.

2. The curable composition of claim 1, wherein the organosiloxane compound in the polymerized product (A) has a molar ratio of an alkenyl group bound to a silicon atom with respect to the total silicon atoms in the organosiloxane compound in the polymerized product (A) ranging from 0.02 to 0.15.

3. The curable composition of claim 1, wherein the organosiloxane compound in the polymerized product (A) comprises at least one aryl group that is bound to a silicon atom.

4. The curable composition of claim 3, wherein the organosiloxane compound in the polymerized product (A) has a molar ratio of an aryl group bound to a silicon atom with respect to the total silicon atoms in the compound in the polymerized product (A) ranging from 0.3 to 1.3.

5. The curable composition of claim 1, wherein the organosiloxane compound in the polymerized product (A) has a weight average molecular weight of 1,000 to 50,000.

6. The curable composition of claim 1, wherein the organosiloxane compound in the polymerized product (A) comprises at least one difunctional siloxane unit represented by Formula 5 and at least one difunctional siloxane unit represented by Formula 6, and wherein the molar ratio of the difunctional siloxane unit of Formula 6 with respect to the total difunctional siloxane units in the organosiloxane compound in the polymerized product (A) is 30% or more:

$(R^{13}R^{14}SiO)$ [Formula 5]

$(R^{15}R^{16}SiO)$ [Formula 6]

wherein $R^{13}$ and $R^{14}$ independently represent an alkyl group, and $R^{15}$ and $R^{16}$ independently represent an aryl group.

7. The curable composition of claim 1, wherein the organosiloxane compound (B) has a molar ratio of an alkenyl group bound to a silicon atom with respect to the total silicon atoms in the compound (B) ranging from 0.15 to 0.3.

8. The curable composition of claim 1, wherein the organosiloxane compound (B) comprises at least one aryl group that is bound to a silicon atom.

9. The curable composition of claim 8, wherein the organosiloxane compound (B) has a molar ratio of an aryl group bound to a silicon atom with respect to the total silicon atoms in the compound (B) ranging from 0.35 to 1.2.

10. The curable composition of claim 1, wherein the organosiloxane compound (B) has a weight average molecular weight of 1,000 to 5,000.

11. The curable composition of claim 1, wherein the hydrogen siloxane compound (C) has a molar ratio of a hydrogen atom bound to a silicon atom with respect to the total silicon atoms in the compound (C) ranging from 0.3 to 0.75.

12. The curable composition of claim 1, wherein the hydrogen siloxane compound (C) comprises at least one aryl group that is bound to a silicon atom.

13. The curable composition of claim 1, wherein the hydrogen siloxane compound (C) has a weight average molecular weight of less than 1,000.

14. The curable composition of claim 1, wherein a molar ratio of a hydrogen atom bound to a silicon atom in the hydrogen siloxane compound with respect to an alkenyl group bound to a silicon atom in the linear and crosslinked organosiloxane compounds ranges from 0.85 to 1.15.

15. The curable composition of claim 1, wherein the linear organosiloxane compound, crosslinked organosiloxane compound and hydrogen siloxane compound comprise at least one aryl group that is bound to a silicon atom.

16. The curable composition of claim 14, satisfying Equations 1 and 2 below:

$|X_{(A)}-X_{(B)}|<0.4$ [Equation 1]

$|X_{(B)}-X_{(C)}|<0.4$ [Equation 2]

wherein $X_{(A)}$ represents a molar ratio of an aryl group bound to a silicon atom with respect to the total silicon atoms in the compound comprised in the polymerized product (A), $X_{(B)}$ represents a molar ratio of an aryl group bound to a silicon atom with respect to the total silicon atoms in the compound (B), and $X_{(C)}$ represents a molar ratio of an aryl group bound to a silicon atom with respect to the total silicon atoms in the compound (C).

17. A semiconductor device that comprises a semiconductor element encapsulated by an encapsulant that comprises the curable composition of claim 1 in a cured state.

18. A light-emitting diode that comprises a light-emitting element encapsulated by an encapsulant that comprises the curable composition of claim 1 in a cured state.

19. A liquid crystal display device that comprises the light-emitting diode of claim 18 in a backlight unit.

20. A lighting device comprising the light-emitting diode of claim 18.

21. The curable composition of claim 1, wherein the hydrogen siloxane compound (C) has a molar ratio of a hydrogen atom bound to a silicon atom with respect to the total silicon atoms in compound (C) ranging from 0.3 to 0.95.

* * * * *